United States Patent
Aizawa (10) Patent No.: US 7,280,373 B2
(45) Date of Patent: Oct. 9, 2007

(54) PRINTED BOARD UNIT AND ELECTRONIC APPARATUS

(75) Inventor: Osamu Aizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 107 days.

(21) Appl. No.: 10/780,603

(22) Filed: Feb. 19, 2004

(65) Prior Publication Data

US 2004/0160745 A1   Aug. 19, 2004

Related U.S. Application Data

(63) Continuation of application No. PCT/JP01/07485, filed on Aug. 30, 2001.

(51) Int. Cl.
   *H05K 1/11* (2006.01)
   *H05K 1/14* (2006.01)
(52) U.S. Cl. ............ 361/803; 361/792; 361/802
(58) Field of Classification Search ........ 361/796–803; 439/65–66
   See application file for complete search history.

(56) References Cited

U.S. PATENT DOCUMENTS

| | | | | |
|---|---|---|---|---|
| 3,478,251 A | * | 11/1969 | Ecclesia et al. | 361/736 |
| 4,498,717 A | * | 2/1985 | Reimer | 439/61 |
| 6,297,957 B1 | * | 10/2001 | Johnson et al. | 361/687 |
| 6,388,895 B1 | * | 5/2002 | Hsu | 361/829 |
| 6,533,587 B1 | * | 3/2003 | Potter et al. | 439/65 |
| 6,687,134 B2 | * | 2/2004 | Vinson et al. | 361/798 |
| 6,934,152 B1 | * | 8/2005 | Barrow | 361/690 |

FOREIGN PATENT DOCUMENTS

| | | |
|---|---|---|
| JP | 55-63195 | 10/1953 |
| JP | 63-16491 | 2/1988 |
| JP | 63-142891 | 9/1988 |
| JP | 1-89791 | 6/1989 |
| JP | 3-90489 | 9/1991 |
| JP | 4-82887 | 7/1992 |
| JP | 4-345083 | 12/1992 |
| JP | 10-177427 | 6/1998 |

* cited by examiner

*Primary Examiner*—Tuan T. Dinh
(74) *Attorney, Agent, or Firm*—Staas & Halsey LLP

(57) ABSTRACT

A printed board unit includes a mother board 60, and a first board unit 70-1 and a second board unit 70-2 that face each other and are vertically mounted onto the mother board 60 with connector devices 100-1 and 100-2. The first board unit 70-1 has memory mounting boards 81-1 horizontally mounted to a region near the lower end of a vertically standing daughter board 71-1. The second board unit 70-2 has memory mounting boards 81-2 horizontally mounted to a region near the upper end of a vertically standing daughter board 71-2. The memory mounting boards 81-1 of the first board unit 70-1 are arranged on the lower side, while the memory mounting boards 81-2 of the second board unit 70-2 are arranged on the upper side.

7 Claims, 9 Drawing Sheets

PRINTED BOARD UNIT AND ELECTRONIC APPARATUS

This application is a continuing application, filed under 35 U.S.C. §111(a), of international Application PCT/JP01/07485,filed Aug. 30, 2001.

FIELD OF THE INVENTION

The present invention relates to printed board units, and more particularly, to an inner structure of an information processing device, such as a multiprocessor device, to which a memory board unit is mounted.

As Internet use has rapidly increased in recent years, the quantity of electronic commercial transactions has also rapidly increased. In electronic commercial transactions, various kinds of information are exchanged with the general public through the Internet. Therefore, servers that can perform high-speed information processing are required.

A server has a multiprocessor device and a power source unit incorporated into a rack, for example. The multiprocessor device includes CPU units that perform information processing, and memory assemblies that store information. Each of the memory assemblies includes a memory board unit. The memory board unit has memory boards arranged on a daughter board. Each of the memory boards has memories mounted on a circuit board.

The rack has a width, a depth, and a height that are specified in the industry. Therefore, the multiprocessor device and the power source unit should each have an exterior size that can be accommodated in the rack.

So as to process information at a higher speed, each CPU unit has an improved performance. As the performance of each PCU unit has improved, each memory assembly is required to have a larger memory capacity.

With the external size of the multiprocessor device being taken into account, however, the size of each memory assembly is required not to increase. Also, the production cost of each memory assembly should not be increased either, when it is put on the market.

BACKGROUND OF THE INVENTION

Figure 1:
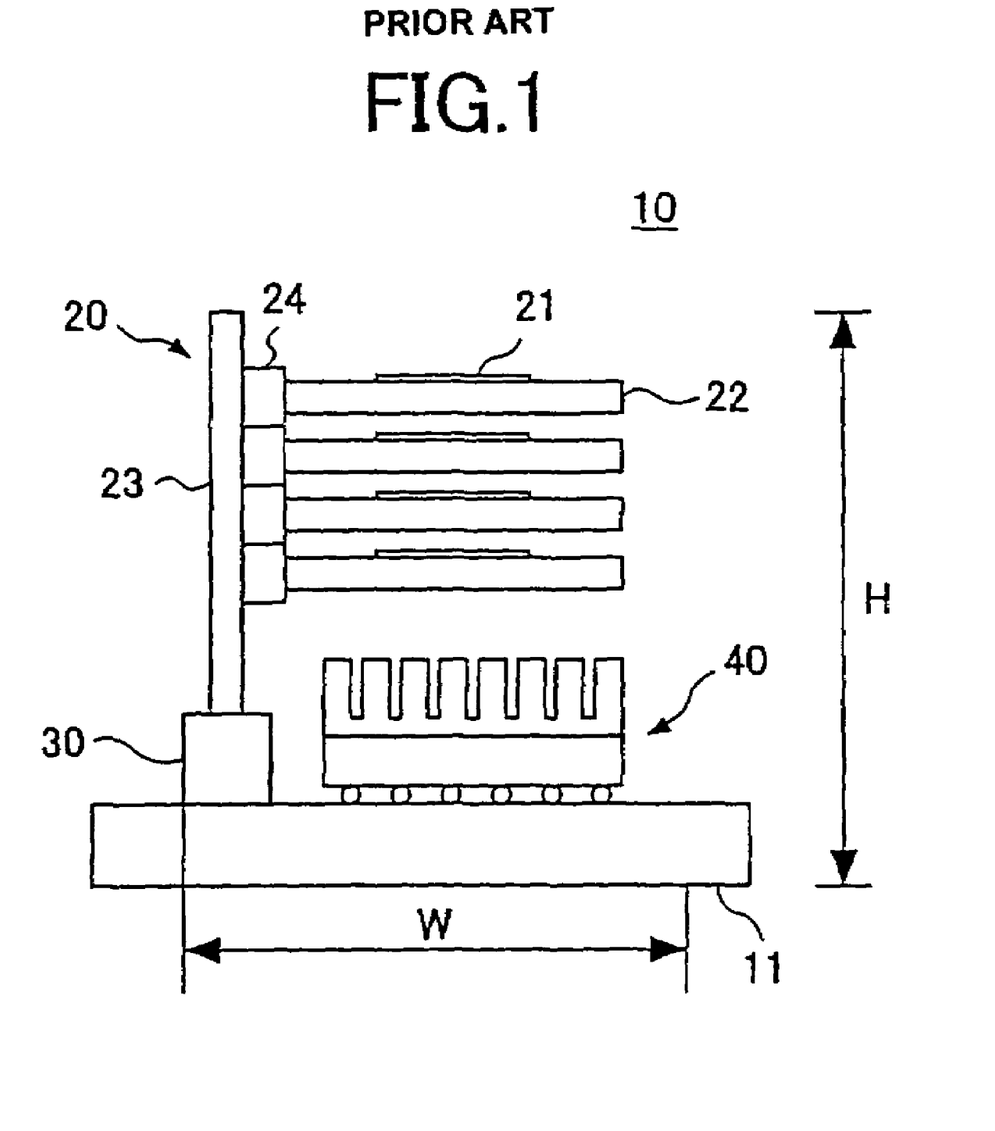
FIG. 1 illustrates a conventional memory assembly.

FIG. 1 illustrates a conventional memory assembly 10. The memory assembly 10 has a memory board unit 20 that stands on a mother board 11 and is connected to the mother board 11 with a connector device 30. The memory assembly 10 also has a crossbar chip device 40 that is flip-chip mounted onto the mother board 11. The memory board unit 20 has memory boards 22 that are arranged on a daughter board 23 and are connected to the daughter board 23 with a connector device 24. Each of the memory boards 22 has memories 21 mounted on a circuit board. The lower end of the daughter board 23 stands on the mother board 11 and is connected to the mother board 11 with the connector device 30. The memory boards 22 horizontally protrude from the daughter board 23. The crossbar chip device 40 is located below the memory boards 22.

The memory assembly 10 has a width of W and a height of H. Hereinafter, W will be used as a unit width, and H will be used as a unit height.

Figure 2:
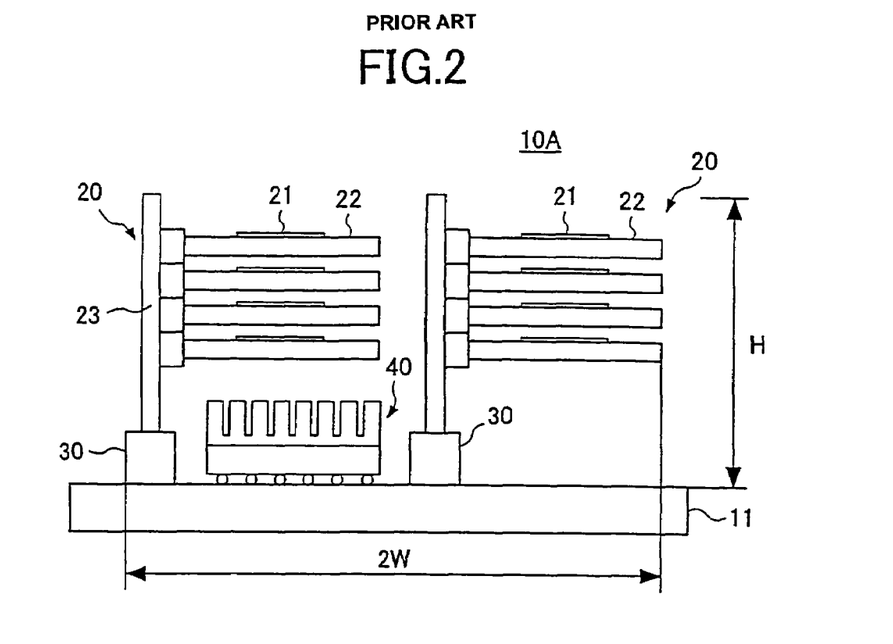
FIG. 2 illustrates an example of a conventional memory assembly having an increased memory capacity.

FIG. 2 illustrates a memory assembly 10A that is a conventional example having an increased memory capacity. The memory assembly 10A is formed by adding another memory board unit 20 to the memory assembly 10 shown in FIG. 1.

This memory assembly 10A has a width of 2×W, which is twice as wide as the conventional memory assembly 10 having the width of W. With such a structure, it is necessary to increase the depth of each multiprocessor device, and it is difficult to put such a multiprocessor device on the market.

Figure 3:
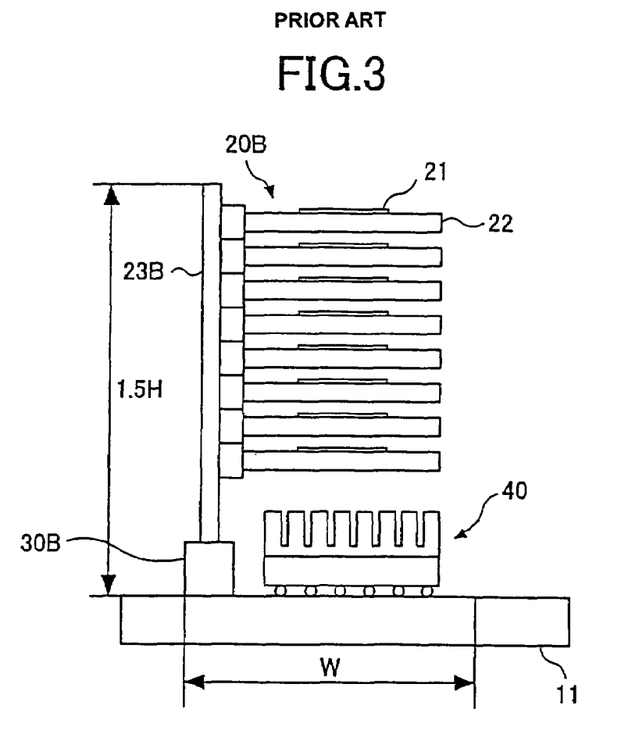
FIG. 3 illustrates another example of a conventional memory assembly having an increased memory capacity.

FIG. 3 illustrates a memory assembly 10B that is another conventional example having an increased memory capacity. The memory assembly 10B includes a memory board unit 20B. This memory board unit 20B has a daughter board 23B that is 1.5 times as tall as the daughter board 23 shown in FIG. 1. Memory boards 22 are mounted to the daughter board 23B. The number of memory boards 22 mounted to the daughter board 22B is twice as large as the number of memory boards 22 contained in the memory assembly 10 shown in FIG. 1.

The memory assembly 10B maintains the width of W.

As the number of memory boards 22 mounted to the daughter board 22B is doubled, a connector device 30B needs to have an increased number of terminals. A ready-made connector cannot serve as the connector device 30B, and a specially designed connector needs to be prepared. As a result, the production cost of the memory assembly 10B increases.

DISCLOSURE OF THE INVENTION

With the above disadvantages being taken into consideration, the principal object of the present invention is to provide a printed board unit that has an increased memory capacity, without an increase of space and a specially designed connector device.

The above object of the present invention is achieved by a printed board unit that has a first board unit and a second board unit facing each other and mounted onto a mother board with a connector device. In this structure, the memory mounting boards of the first board unit are located at a height different from the memory mounting boards of the second board unit. When seen from the top of each daughter board, the memory mounting boards of the first board unit overlap with the memory mounting boards of the second board unit, and face the memory mounting boards of the second board unit.

As the memory mounting boards of the first board unit face the memory mounting boards of the second board unit, and vice versa, the distance between the daughter board of the first board unit and the daughter board of the second board unit is short and does not cause an increase of space.

Since the number of memory mounting boards in the first board unit and the number of memory mounting boards in the second board unit are the same as the number of memory mounting boards in a conventional board unit, the number of connector terminals in each of the first and second board units is also the same as the number of connector terminals in the conventional board unit. Accordingly, a standard connector device can be employed.

As the memory mounting boards of the first board unit overlap with the memory mounting boards of the second board unit and are located at a different height from the memory mounting boards of the second board unit, the board unit having the memory mounting boards located on the upper side can be pulled out while the other board unit remains connected onto the mother board with a connector. Accordingly, the maintenance unit memory capacity does not increase, and the decrease of the memory capacity caused at a time of maintenance is smaller in a multiprocessor device. Thus, the possibility of trouble in server operations can be reduced.

DESCRIPTION OF THE PREFERRED EMBODIMENTS

The following is a description of preferred embodiments of the present invention, with reference to the accompanying drawings.

First Embodiment

Figure 4:
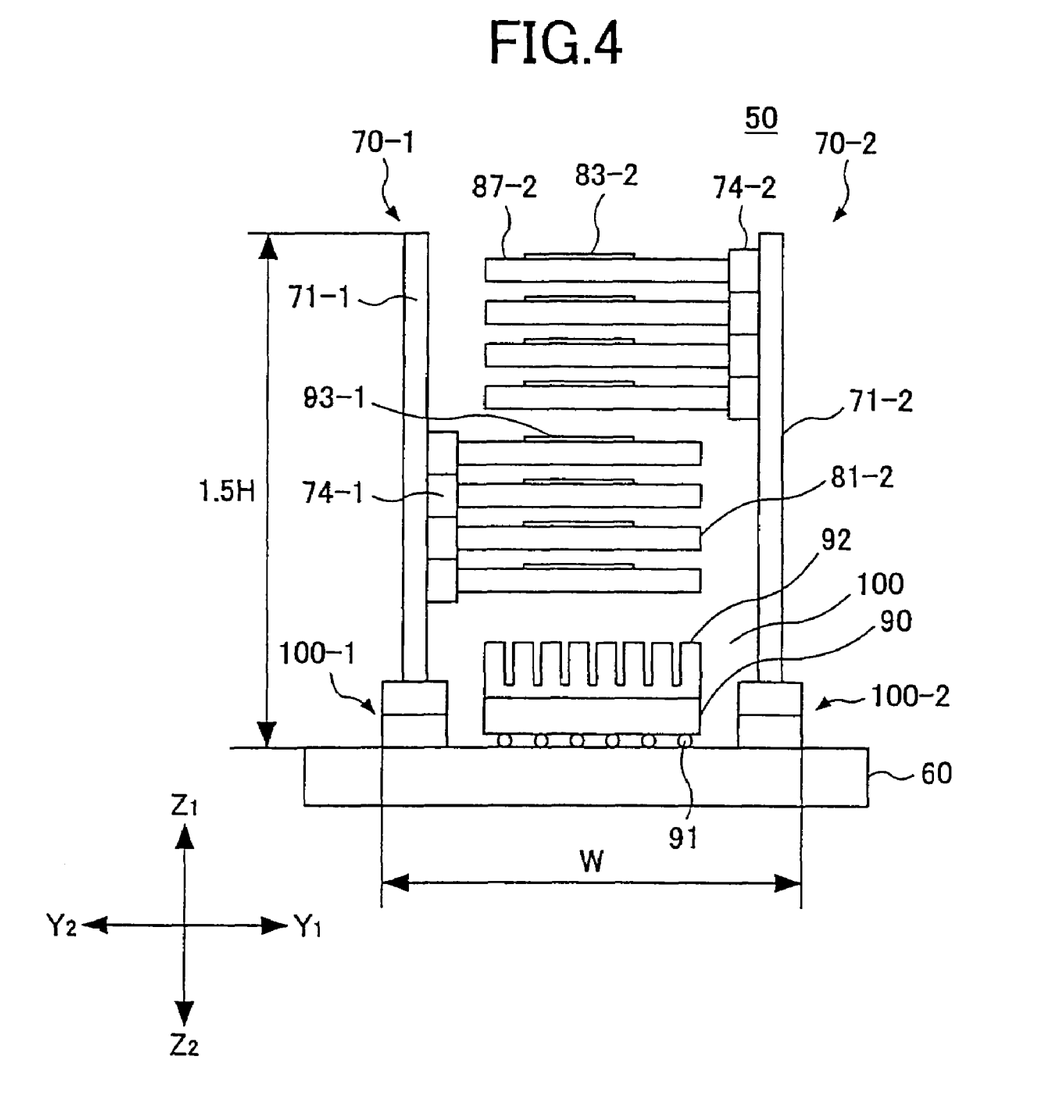
FIG. 4 schematically illustrates a memory assembly of a first embodiment of the present invention.
Figure 5:
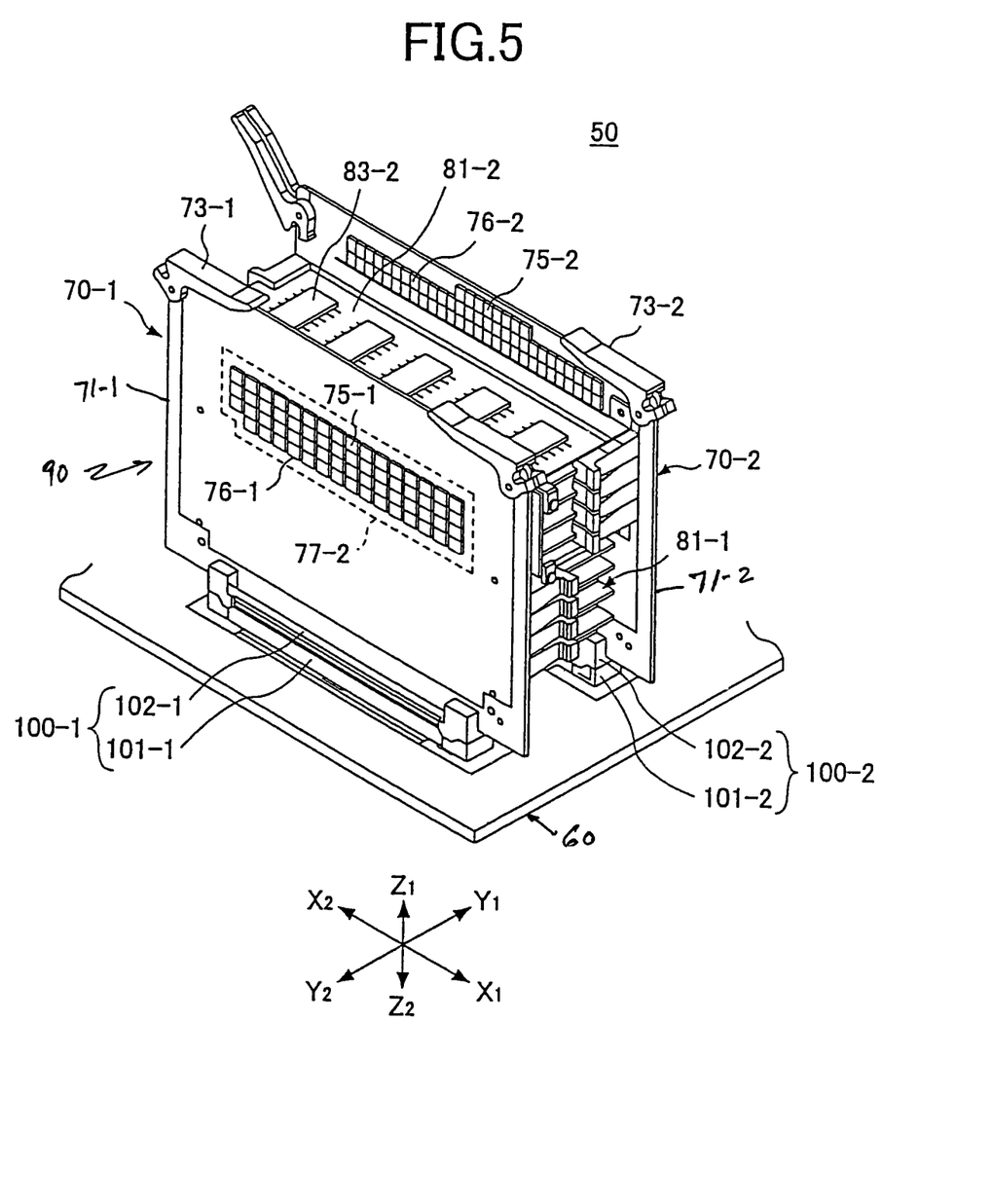
FIG. 5 is a perspective view of the memory assembly of the first embodiment of the present invention.
Figure 6:
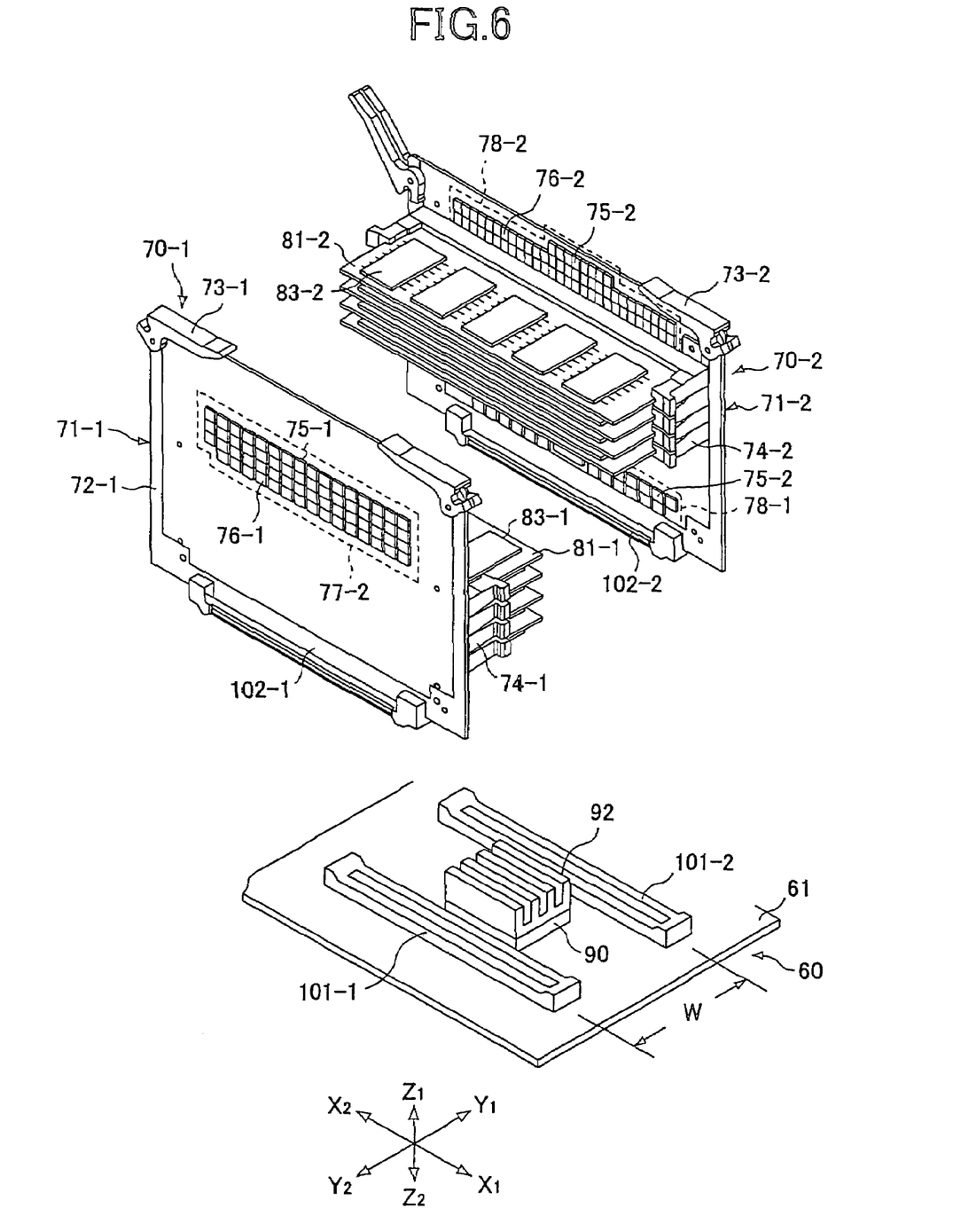
FIG. 6 is an exploded perspective view of the memory assembly of FIG. 5.

FIGS. 5 and 6 illustrate a memory assembly 50 of a first embodiment of the present invention. FIG. 4 schematically illustrates the memory assembly shown in FIG. 5.

The memory assembly 50 includes a mother board 60, a first board unit 70-1 and a second board unit 70-2 that stand from the mother board 60 and are separated from each other by a length of W in the direction of Y1-Y2, and a crossbar IC chip package 90. The first board unit 70-1 and the second board unit 70-2 are connected to the mother board 60 with daughter-board connecting devices 100-1 and 100-2. The daughter-board connecting devices 100-1 and 100-2 are ready-made devices, and include daughter-board female connectors 101-1 and 101-2, and daughter-board male connectors 102-1 and 102-2.

The mother board 60 includes a motherboard main body 61, the daughter-board female connectors 101-1 and 101-2 that are separated from each other by a length of W in the direction of Y1-Y2 on the upper surface of the mother-board main body 61, and the crossbar IC chip package 90 that is mounted between the female connectors 101-1 and 101-2 on the upper surface of the mother-board main body 61. The crossbar IC chip package 90 is flip-chip mounted onto the mother board main body 61 with bumps 91. A heat sink 92 is fixed onto the upper surface of the crossbar IC chip package 90.

Figure 7:
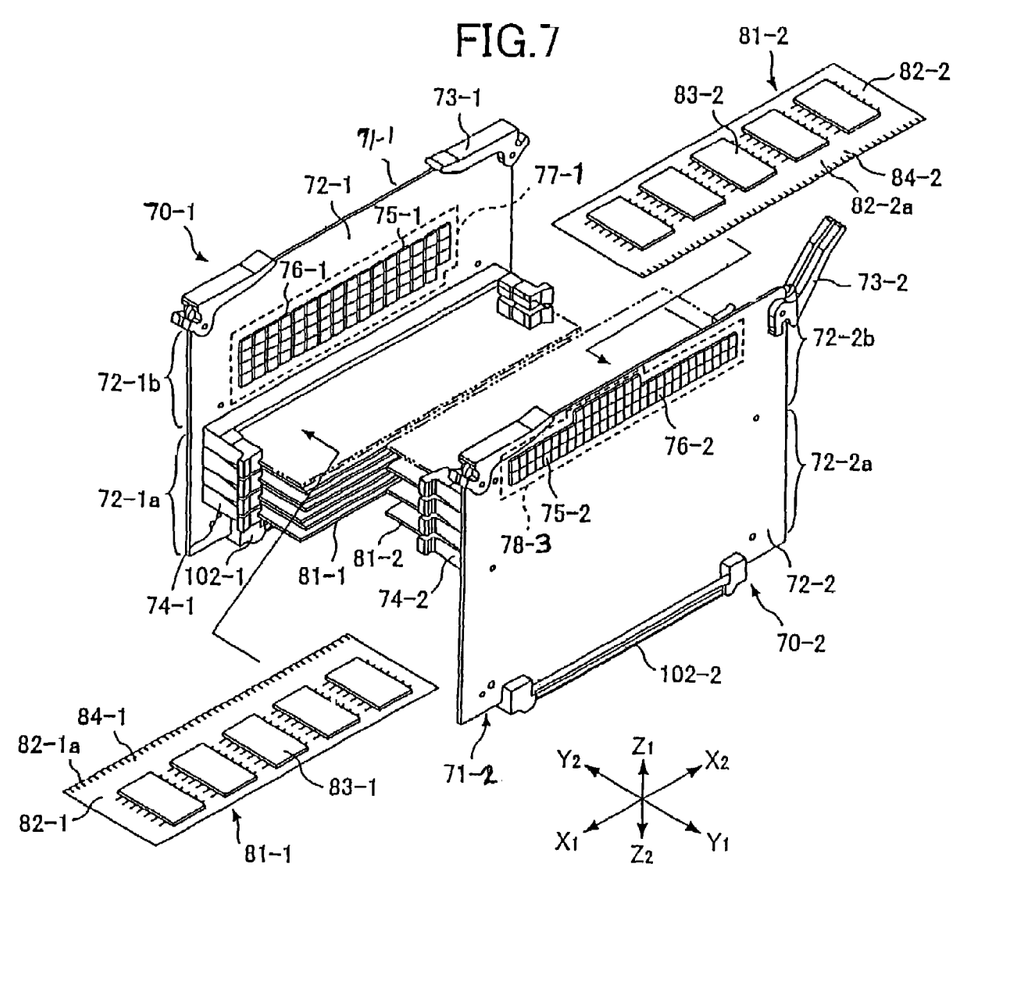
FIG. 7 is a perspective view of the first and second board units, seen from a different side from those of FIG. 6.

The first board unit 70-1 includes a daughter board 71-1 and four memory mounting boards 81-1. As shown in FIGS. 6 and 7, the daughter board 71-1 extends in the vertical direction, and the memory mounting boards 81-1 horizontally protrude from the daughter board 71-1 in a comb-like fashion.

The daughter board 71-1 includes: a daughter-board main body 72-1; the daughter-board male connector 102-1 that is provided at the lower end of the daughter-board main body 72-1; a mounting operation lever 73-1 that is provided at the upper end of the daughter-board main body 72-1; a card edge connector 74-1 that is mounted on a half area 72-1a at the Z2 side of the daughter-board main body 72-1 and connects the memory mounting boards 81-1 to the daughter-board main body 72-1; terminal resistances 75-1 that prevent signal reflections and are mounted on either surface of the other half area 72-1b at the Z1 side of the daughter-board main body 72-1; and bypass capacitors 76-1 that bypass a dielectric layer in the daughter-board main body 72-1, which has a multi-layer structure. Reference numerals 77-1 and 77-2 indicate electronic parts mounting regions to which the terminal resistances 75-1 and the bypass capacitors 76-1 are mounted.

As shown in FIG. 7, each of the memory mounting boards 81-1 includes a board main body 82-1, and memories 83-1 that are ready-made memories arranged on the board main body 82-1. Terminals 84-1 are arranged at an end 82-1a of the board main body 82-1.

Each of memory mounting boards 81-1 has the end 82-1a insert-connected to the card edge connector 74-1. The memory mounting boards 81-1 protrude horizontally from the half area 72-1a at the Z2 side of the vertically standing daughter board 71-1.

The second board unit 70-2 includes a vertically standing daughter board 71-2 and four memory mounting boards 81-2 that horizontally protrude in a comb-like fashion from the Z1 side half of the daughter board 71-2, as shown in FIGS. 6 and 7. The second board unit 70-2 is substantially the same as the first board unit 70-1, except that the memory mounting boards 81-2 are located on the Z1-side half of the daughter board 71-2.

The daughter board 71-2 includes: a daughter-board main body 72-2; the daughter-board male connector 102-2 that is provided at the lower end of the daughter-board main body 72-2; a lever 73-2 that is provided at the upper end of the daughter-board main body 72-2; a card edge connector 74-2 that is mounted to a half area 72-2b at the Z1 side of the daughter-board main body 72-2 and connects the memory mounting boards 81-2 to the daughter-board main body 72-2; terminal resistances 75-2 that are mounted to the inner surface of a half area 72-2a at the Z2 side of the daughter-board main body 72-2 and both of the surfaces near the end on the Z1 side; and bypass capacitors 76-2. Reference numerals 78-1, 78-2, and 78-3, indicate electronic parts mounting regions to which the terminal resistances 75-2 and the bypass capacitors 76-2 are mounted.

Like the memory mounting boards 81-1 shown in FIG. 7, each of the memory mounting boards 81-2 includes a board main body 82-2 and memories 83-2 that are ready-made memories arranged on the board main body 82-2. Terminals 84-2 are also arranged at an end 82-2a of the board main body 82-2.

Each of the memory mounting boards 81-2 has the end 82-2a insert-connected to the card edge connector 74-2. The memory mounting boards 81-2 horizontally protrude from the half area 72-2b at the Z1 side of the vertically standing daughter board 71-2.

Referring now to FIGS. 4 and 5, the structure of the memory assembly 50 will be further described.

The first board unit 70-1 is mounted on the mother board 60, with the daughter-board male connector 102-1 being connected to the daughter-board female connector 101-1. The daughter board 71-1 is perpendicular to the mother board 60. The memory mounting boards 81-1 extend in parallel with the mother board 60.

The second board unit 70-2 is mounted on the mother board 60, with the daughter-board male connector 102-2 being connected to the daughterboard female connector 101-2. The daughter board 71-2 is perpendicular to the mother board 60. The memory mounting boards 81-2 extend in parallel with the mother board 60.

The memory mounting boards 81-1 extend toward the daughter board 71-2, and the memory mounting boards 81-2 extend toward the daughter board 71-1.

In the direction of Z1-Z2, the memory mounting boards 81-1 are located on the lower side, and the memory mounting boards 81-2 are located on the upper side. Seen from the Z1 side, the memory mounting boards 81-2 overlap with the memory mounting boards 81-1, and the memory mounting boards 81-1 are located below the memory mounting boards 81-2.

The top ends of the memory mounting boards 81-1 face the electronic parts mounting region 78-1 on the daughter board 71-2. The top ends of the memory mounting boards 81-2 face the electronic parts mounting region 77-1 on the daughter board 71-1.

The crossbar IC chip package 90 is located in a space formed under the memory mounting boards 81-1.

Having both the memory mounting boards 81-1 and the memory mounting boards 81-2, the memory assembly 50 has a memory capacity that is twice as large as the memory capacity of a structure having only one board unit.

The memory assembly 50 has a width of W and a height of 1.5×H.

The memory assembly 50 has the following features.

1) The width is W, which is the same as the width of a structure having only one board unit.

As the memory mounting boards 81-1 of the first board unit 70-1 face the memory mounting boards 81-2 of the second board unit 70-2 and vice versa, the distance between the daughter board 71-1 of the first board unit 70-1 and the daughter board 72-1 of the second board unit 70-2 is W, which is also the same as that in a structure having only one board unit. Therefore, it is not necessary to increase the width of a multiprocessor into which a plural number of memory assemblies 50 are to be incorporated. Thus, a large number of memory assemblies 50 can be incorporated into a multiprocessor of a size that can be accommodated in a rack.

2) Ready-made devices can serve as the daughter-board connector devices 100-1 and 100-2.

The number of the memory mounting boards 81-1 of the first board unit 70-1 and the number of the memory mounting boards 81-2 of the second board unit 70-2 are the same as the number of the memory mounting boards of a conventional board unit. Accordingly, the number of terminals in each of the connectors 102-1 and 102-2 of the first and second board units 70-1 and 70-2 is the same as that of a conventional board unit, and standard connector devices can be employed. Thus, the production cost of the memory assembly 50 can be low.

3) The maintenance unit memory capacity is the same as that of a conventional board unit, and is not increased.

As the memory mounting boards 81-2 are located above the memory mounting boards 81-1, the second board unit 70-2 can be pulled out, while the first board unit 70-1 remains connected onto the mother board 60 with a connector. Accordingly, the maintenance unit memory capacity does not increase, and a multiprocessor has a smaller decrease of memory capacity at a time of maintenance. Thus, there is a smaller possibility of trouble in server operations.

4) The assembling can be smoothly performed.

The first board unit 70-1 is first mounted. When the second board unit 70-2 is mounted, the memory mounting boards 81-2 do not interfere with the memory mounting boards 81-1. Thus, the assembling of the memory assembly 50 can be smoothly performed.

When the memory assembly 50 is disassembled, the second board unit 70-2 is first pulled out, and the first board unit 70-1 is then pulled out. In this manner, the disassembling is also smoothly performed.

Figure 8:
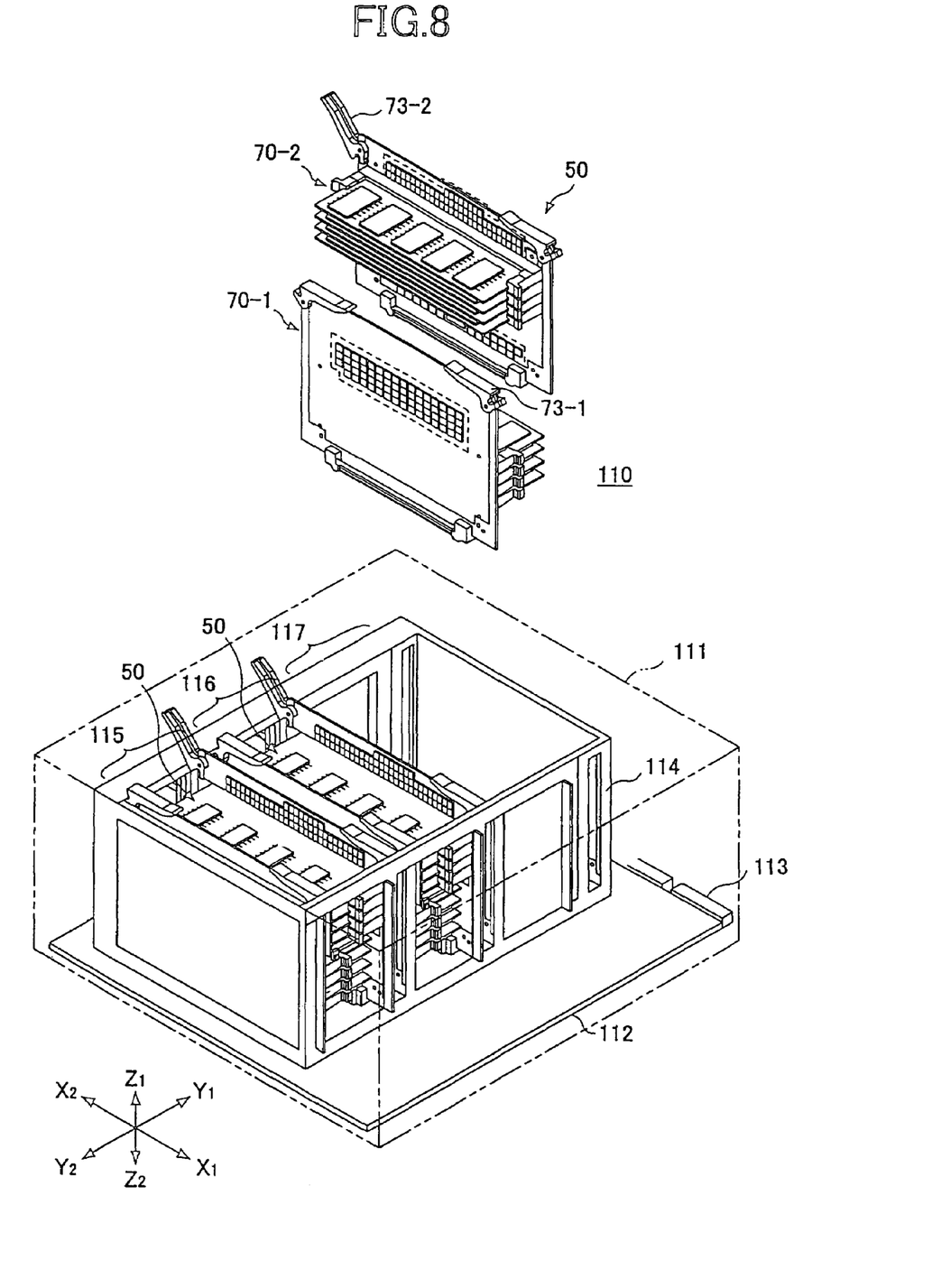
FIG. 8 is a perspective view of a multiprocessor device that includes memory assemblies of the first embodiment of the present invention.

FIG. 8 illustrates a situation in which the above described memory assembly 50 is incorporated into a multiprocessor device 110.

The multiprocessor device 110 includes a housing body 111 of a size that can be accommodated in a rack, and three memory assemblies 50 that are arranged in the direction of Y1-Y2 inside the housing body 111.

A mother board 112 is provided on the bottom plate of the housing body 111. A connector 113 is mounted to the Y1 end of the mother board 112. A box-like frame 114 is fixed onto the mother board 112. The frame 114 includes three blocks 115, 116, and 117, and the memory assembly 50 is incorporated into each of the blocks 115, 116, and 117.

In FIG. 8, the block 117 has the memory assembly 50 pulled out. The levers 73-1 and 73-2 are rotated to be partially engaged with the frame 114, so that the first board unit 70-1 and the second board unit 70-2 are pushed down toward the Z2 side and are then mounted. At a time of maintenance, the first board unit 70-1 and the second board unit 70-2 are pulled up toward the Z1 side and are then removed.

The multiprocessor device 110 is moved toward the Y1 side to be accommodated in a rack, and the connector 113 is connected to a connector provided on a back panel fixed to the rack.

Second Embodiment

Figure 9:
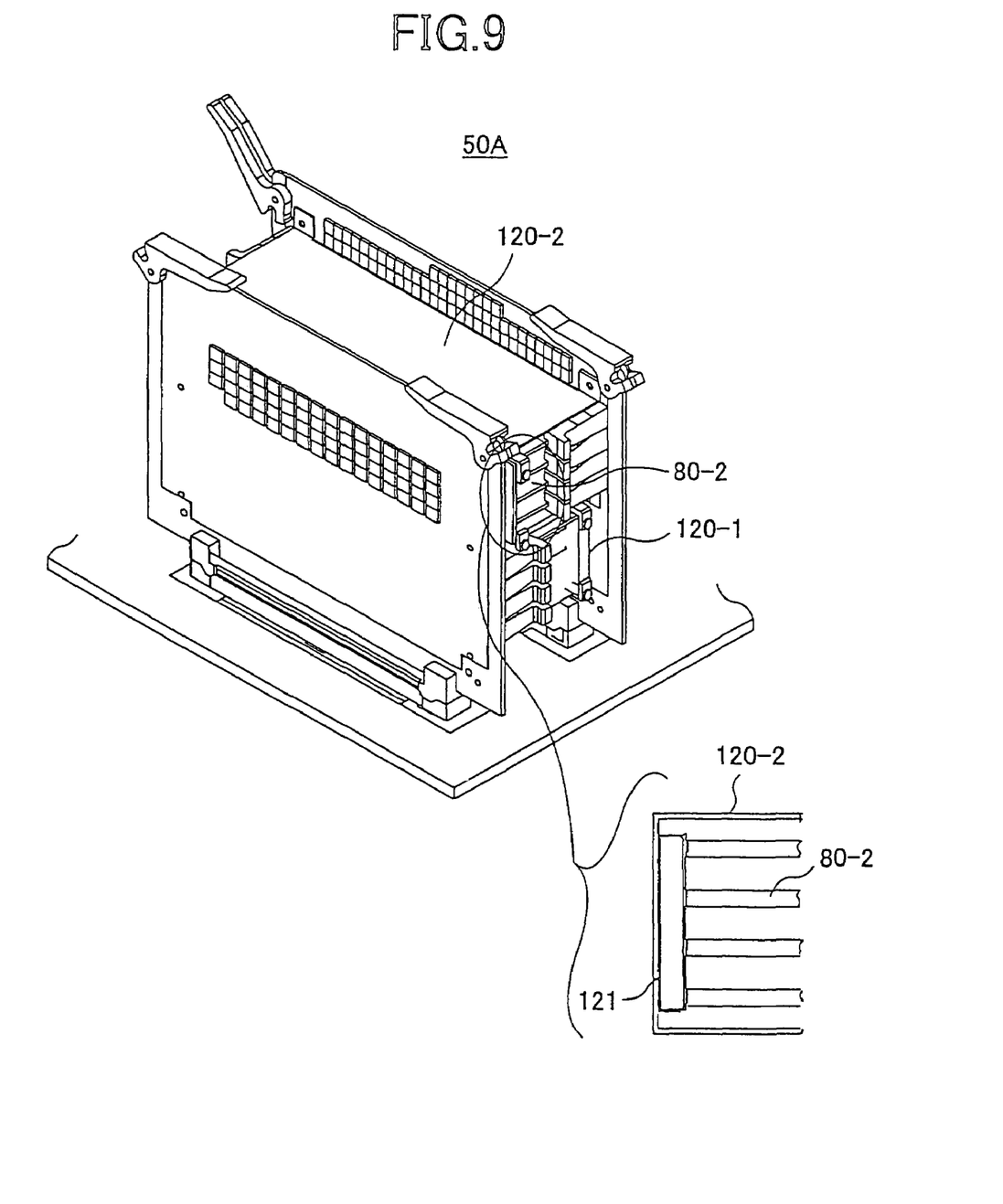
FIG. 9 is a perspective view of a memory assembly of a second embodiment of the present invention.

FIG. 9 illustrates a memory assembly 50A of a second embodiment of the present invention.

The memory assembly 50A is the same as the memory assembly 50 shown in FIG. 5, except that memory mounting board holders 120-1 and 120-2 are added. Each of the memory mounting board holders 120-1 and 120-2 is U-shaped. The memory mounting board holders 120-1 and 120-2 are fixed to the daughter boards 71-1 and 71-2, respectively, and cover the memory mounting boards 81-1 and 81-2, respectively. An elastic sheet 121 is interposed between each of the memory mounting board holders 120-1 and 120-2 and the top ends of the memory mounting boards 81-1 and 81-2. With the elastic sheet 121, the top ends of the memory mounting boards 81-1 and 81-2 are elastically held. When receiving shock or vibration, the memory mounting boards 81-1 and 81-2 do not move greatly, and are prevented from falling off.

With this structure, the memory assembly 50A is resistant to shock and vibration.

Third Embodiment

Figure 10:
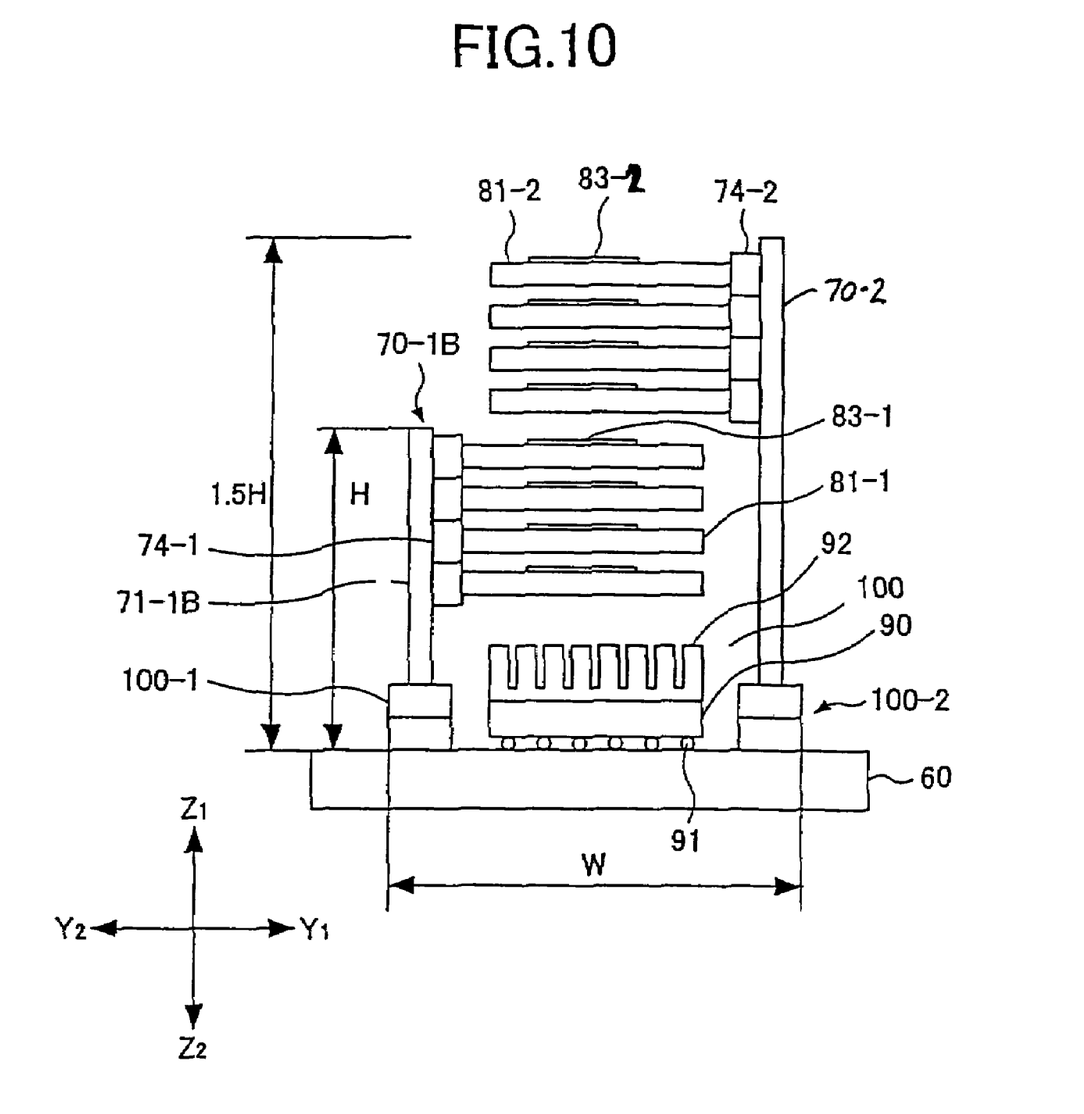
FIG. 10 schematically illustrates a memory assembly of a third embodiment of the present invention.

FIG. 10 illustrates a memory assembly 50B of a third embodiment of the present invention.

The memory assembly 50B differs from the memory assembly 50 shown in FIG. 5 in a first board unit 70-1B. The daughter board 71-1B of the first board unit 70-1B is shorter than the daughter board 71-1 shown in FIG. 5, and has a height of H. The top ends of the memory mounting boards 81-2 of the second board unit 70-2 are exposed.

In each of the above embodiments, the number of memory mounting boards 81-1 and the number of memory mounting boards 81-2 may be one each.

Also, other electronic parts may be mounted, instead of the memory mounting boards 81-1 and 81-2. The connectors that connect the memory mounting boards 81-1 and 81-2 to the daughter boards 71-1 and 71-2 are not limited to card edge connectors. Also, other types of connector devices may be employed, instead of the daughter-board connector devices 100-1 and 100-2.

The invention claimed is:

1. A printed board unit, comprising:
   a mother board; and
   a first board unit and a second board unit that are vertically mounted onto the mother board and face each other,
   the first board unit including a vertically standing first daughter board and a set of electronic parts first mounting boards that horizontally protrude from the first daughter board,
   the second board unit including a vertically standing second daughter board and a set of electronic parts second mounting boards that horizontally protrude from the second daughter board,
   the set of electronic parts first mounting boards of the first board unit and the set of electronic parts second mounting boards of the second board unit facing each other, being located at different heights relative to the mother board, and overlapping each other when seen from the tops of the first and second daughter boards.

2. The printed board unit as claimed in claim 1, wherein each of the electronic parts first and second mounting boards has a plurality of memories mounted to a circuit board.

3. An electronic apparatus into which a printed board unit as claimed in claim 1 is incorporated.

4. A printed board unit, comprising:
   a mother board; and
   a first board unit and a second board unit that are vertically mounted onto the mother board and face each other,
   the first board unit including a vertically standing first daughter board that has a first connectors near the lower end thereof, and respective electronic parts first mounting boards connected to a lower region of the first daughter board with the first connectors and horizontally protruding from the first daughter board,
   the second board unit including a vertically standing second daughter board that has second connectors near the upper end thereof, and respective electronic parts second mounting boards connected to an upper region of the second daughter board with the second connectors and horizontally protruding from the second daughter board,
   the electronic parts first mounting boards of the first board unit being located on a lower side thereof while the electronic parts second mounting boards of the second board unit are located on an upper side thereof,
   the electronic parts first mounting boards of the first board unit and the electronic parts second mounting boards of the second boards unit facing each other and overlapping with each other when seen from tops of the first and second daughter boards.

5. The printed board unit as claimed in claim 4, wherein:
   the first daughter board of the first board unit has an electronic parts first mounting region in which an electronic part is mounted to an area near the upper end thereof;
   the second daughter board of the second board unit has an electronic parts second mounting region in which an electronic part is mounted to an area near the lower end thereof:
   the electronic parts second mounting board of the second board unit is located in a position opposite to the electronic parts first mounting region on the first daughter board of the first board unit; and
   the first electronic parts mounting board of the first board unit is located in a position opposite to the second electronic parts mounting region on the second daughter board of the second board unit.

6. The printed board unit as claimed in claim 4, wherein:
   a semiconductor part is mounted between the first daughter board of the first board unit and the second daughter board of the second board unit on the mother board; and
   the semiconductor part is accommodated in a space that is formed below the first electronic parts mounting board of the first board unit.

7. A printed board unit, comprising:
   a mother board; and
   a first board unit and a second board unit that are vertically mounted onto the mother board and face each other,
   the first board unit including a vertically standing first daughter board that has a first connectors, and respective electronic parts first mounting boards connected to the first daughter boards with the first connectors and horizontally protruding from the first daughter board,
   the second board unit including a vertically standing second daughter board that is taller than the first daughter board of the first board unit and has a second connectors near an upper end thereof, and respective electronic parts second mounting boards connected to an upper region of the second daughter board with the second connectors and horizontally protruding from the second daughter board,
   the electronic parts first mounting boards of the first board unit being located on a lower side thereof and the electronic parts second mounting boards of the second board unit being located on an upper side thereof, and
   the electronic parts first mounting boards of the first board unit and the electronic parts second mounting boards of the second board unit facing each other and overlapping with each other when seen from tops of the first and second daughter boards.

* * * * *

UNITED STATES PATENT AND TRADEMARK OFFICE
CERTIFICATE OF CORRECTION

PATENT NO. : 7,280,373 B2  Page 1 of 1
APPLICATION NO. : 10/780603
DATED : October 9, 2007
INVENTOR(S) : Osamu Aizawa It is certified that error appears in the above-identified patent and that said Letters Patent is hereby corrected as shown below:

Column 8, Line 36, after "has" delete "a".

Column 8, Line 42, after "has" delete "a".

Signed and Sealed this

Eighth Day of April, 2008

JON W. DUDAS
*Director of the United States Patent and Trademark Office*